United States Patent
Rückert et al.

(10) Patent No.: US 6,413,314 B1
(45) Date of Patent: Jul. 2, 2002

(54) DOCTOR ROD FOR A COATING DEVICE

(75) Inventors: Hans Rückert, Ratingen; Ulrich Schoof, Düsseldorf, both of (DE)

(73) Assignee: Jagenberg Papiertechnik GmbH, Neuss (DE)

( * ) Notice: Subject to any disclaimer, the term of this patent is extended or adjusted under 35 U.S.C. 154(b) by 0 days.

(21) Appl. No.: 09/786,801

(22) PCT Filed: Aug. 26, 1999

(86) PCT No.: PCT/EP99/06256

§ 371 (c)(1),
(2), (4) Date: Mar. 7, 2001

(87) PCT Pub. No.: WO00/14332

PCT Pub. Date: Mar. 16, 2000

(30) Foreign Application Priority Data

Sep. 8, 1998 (DE) .......................................... 198 40 951

(51) Int. Cl.[7] .............................. B05C 1/08; B05C 11/02
(52) U.S. Cl. ......................... 118/119; 118/126; 118/261; 118/414
(58) Field of Search ..................... 118/100, 118, 118/119, 123, 126, 261, 414

(56) References Cited

FOREIGN PATENT DOCUMENTS

| DE | 39 37 749 | 11/1989 |
|---|---|---|
| EP | 0 207 921 | 1/1987 |
| EP | 0 454 643 | 10/1991 |
| EP | 0 456 847 | 11/1991 |
| FR | 2 770 156 | 4/1999 |

*Primary Examiner*—Laura Edwards
(74) *Attorney, Agent, or Firm*—Herbert Dubno

(57) ABSTRACT

Known doctor rods (1) used as dosing elements in coating devices have a cylindrical steel base body on whose cover surface a chromium or ceramic layer of hard material is applied. According to the invention, the cracks and craters in the layer of hard material are closed by a joint which is produced by means of an ion implantation process, by the hard material reacting with the ions applied in a plasma. The improved doctor rods have a longer service life than known doctor rods.

16 Claims, 1 Drawing Sheet

DOCTOR ROD FOR A COATING DEVICE

CROSS REFERENCE TO RELATED APPLICATIONS

This is a national stage of PCT/EP99/06256 filed Aug. 26, 1999 and based upon German National application 198 40 951.6 filed Sep. 8, 1998 under the International Convention.

TECHNOLOGICAL FIELD

The invention relates to a doctor rod for a coating device, especially for a device for the coating of paper or cardboard webs with pigmented coloring agents, which have a cylindrical base body of steel onto whose outer surface a hard material layer of chromium or ceramic is applied.

STATE OF THE ART

In applicator and metering systems of apparatus for the coating of paper or cardboard webs, doctor bars are used in a known manner as metering elements. They serve to produce a precisely metered film of coating material (glue, sizing or starch, pigmented coloring agents, etc.) on a roller or directly on a paper or cardboard web by doctoring off the excess which has been applied by an applicator unit upstream thereof.

In the coating of paper or cardboard webs, doctor bars with a diameter between 8 mm and 50 mm are used and can extend over the entire working width and which can thus have a length up to 10 m. So that the doctor bar is supported over its entire length against sagging, it is usually supported in a bed of an elastomeric material which has an opening turned toward the roller or web and from which the periphery of the doctor bar projects. A doctor bar supported in this manner is described in DE 30 22 955-C.

The doctor bars either have a smooth outer surface (EP 0 454 643-B1) or are profiled on their outer surface with circumferential grooves (DE 37 35 889-A1). With doctor bars with profiled outer surfaces, the coating thickness of the metered film on the roller/web can be influenced by the free cross sectional areas of the grooves. They are preferably used in indirect applicator processes to apply a metered film of the coating material onto a roller which then transfers the coating material onto a web in a pressing gap (EP 0 453 427-A2).

Since the doctor bars, especially in application of pigment coloring agent coatings which have abrasive effects, are highly stressed in the wear sense, it is known to form them from a cylindrically shaped base body of steel which is coated with a hard material layer of chromium (EP 0 454 643-B1) or of ceramic (DE 39 37 749-A1). Even doctor bars provided with a hard material layer of chromium or ceramic wear in use so that they must be replaced at regular time intervals.

OBJECT OF THE INVENTION

The object of the invention is to provide a doctor bar for a coating apparatus which has a greater useful life by comparison with the known doctor bars.

SUMMARY OF THE INVENTION

This object is attained with a coating apparatus which has a cylindrical base body of steel and on whose outer surface a hard material layer of chromium or ceramic is applied, wherein the cracks and craters in the surface of the hard material layer are closed by a compound produced in an ion implantation process by the reaction of the hard material with ions applied in a plasma.

It has been found that in the application of the hard material layer to the base body of steel, microcracks and microcraters arise in its surface and negatively effect the wear resistance and corrosion characteristics of the doctor bar. Additionally, the surface finishing of the invention increases the hardness of the doctor bar. A further advantage is that the coating quality of the films metered onto a surface by the doctor bar can be improved since the surface of the doctor bar has a reduced roughness. The coating is thus more uniform.

According to the invention, the hard material surface is treated with an ion mixture in the production of the doctor bar which contains nitrogen and/or carbon atoms but does not contain any nonmetal ions. The covering compound can be composed of chromium nitride, chromium carbide and/or chromium carbonitride. A chromium layer of 20 $\mu$m to 60 $\mu$m, preferably 40 $\mu$m to 50 $\mu$m, in thickness can be applied as the hard material layer. The chromium layer after the plasma treatment can have a hardness in excess of 1200 HV, preferably from 1400 HV to 1600 HV. The outer surface of the doctor bar has circumferentially extending grooves. In a central longitudinal section through the doctor bar the open cross sectional area of the grooves can amount to between 25 mn$^2$ and 150 mn$^2$. The circumferential grooves can have a width measured in the axial direction of the doctor bar of 0.1 mm to 0.3 mm and a depth of 0.07 mm to 0.13 mm.

An apparatus for coating a material web, especially a paper or cardboard web with a pigment coloring agent, can have two rollers journaled in a support adjacent one another with parallel axes. One roller is fixedly located and the other roller is pressable against the first. At least one applicator and meter system is provided which can be pressed against the surface of one of the rollers outside of the press gap formed by the rollers. The metering system can include as a metering element a doctor bar as has been described.

BRIEF DESCRIPTION OF THE DRAWING

The drawing serves for clarification of the invention based upon a simply illustrated embodiment.

MANNER OF PRACTICING THE INVENTION

Figure 1:
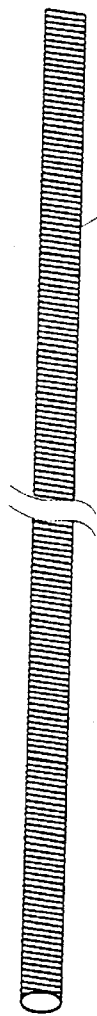
FIG. 1 shows a doctor bar according to the invention.

The doctor bar 1 shown in FIG. 1 has a cylindrical base body of a stainless and acid resistant steel onto whose outer surface a hard material layer of chromium or ceramic is applied. Preferably a chromium layer is applied as the hard material layer with a thickness of 20 $\mu$m to 60 $\mu$m, preferably 40 $\mu$m to 50 $\mu$m. Its axial length is matched to the working width of the coating apparatus which can amount to up to 10 m. The outer diameter of the doctor bar 1 amounts to 8 mm to 50 mm, in the example about 12 mm. Depending upon the particular use, the outer surface of the doctor bar 1 is smooth or contains, as is shown in FIG. 1, circumferentially extending grooves. The circumferentially extending grooves are worked into the hard material layer, here the chromium layer by so-called rolling tools. The grooves extend helically with a certain pitch angle. The grooves are so formed that they have a width measured in the axial direction of the doctor bar from 0.1 mm to 0.3 mm and a depth of 0.07 mm to 0.13 mm. The open cross section of the grooves in a central longitudinal section through the bar amounts to between 25 mm$^2$ and 150 mm$^2$ per meter of the doctor bar length.

After application of the hard material layer and with grooved doctor bars, after the working of the grooves into the doctor bar, the surface of the hard material layer is surface finished by an ion implantation process. The surface of the hard material layer is bombarded with energetic ions in a plasma state and which react with the hard material and which produce a bonding or compound therewith. The physical parameters of the ion implantation process are so adjusted that the cracks and craters in the surface are covered by the resulting compound without detrimental covering of the grooves. Preferably the hard material surface is treated with an ion mixture containing nitrogen and/or carbon ions but which does not contain any nonmetal ions. An ionized gas which has been found to be suitable in the plasma state is a mixture of $NH_3$ or $N_2$ and $CO_2$ with an inert gas (helium or argon). The result is the formation of a compound which covers the cracks and craters in the surface and which is composed of chromium nitride and/or chromium carbide and/or chromium carbonitride. In addition, the hardness of the hard material layer is increased. By the surface treatment of a chromium layer, a hardness after the plasma treatment of more than 1200 HV, preferably from 1400 HV to 1600 HV. A doctor bar which is surface treated in this manner has a useful life which is increased a number of times over the doctor bar without such treatment and applies the coating material more uniformly.

Figure 2:
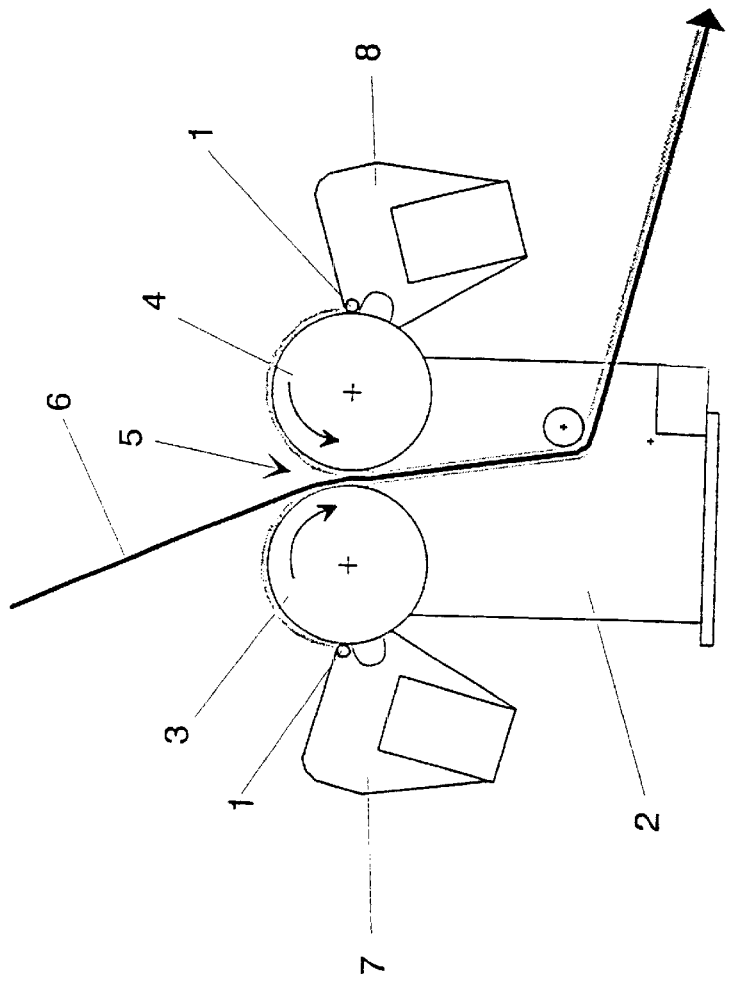
FIG. 2 shows in diagrammatic form a coating device in which the doctor bar is preferably used.

Preferably the doctor bar 1 with its surface treatment according to the invention is used in a coating apparatus for the coating of paper or cardboard webs with pigment coloring agents is applicable by spreading and which in principle has been shown in FIG. 2. The coating apparatus includes two rollers 3, 4 with mutually parallel axes and disposed adjacent one another in a frame 2 and of which one roller 3 is stationarily located and the other roller 4 can be pressed circumferentially against the stationarily located roller 3 to define a pressing gap 5 therewith through which the paper or cardboard web 6 is fed from above to leave from below. Both rollers 3 and 4 are rubberized on their outer surfaces.

Outside the region of the pressing gap 5 preferably diametrically opposite to it, on each roller 3, 4 an applicator and metering system 7, 8 can be arranged which can be swingable toward the respective rollers 3, 4. From each applicator and metering system 7, 8, coating material (here a pigmented spreadable coloring agent) is applied to the outer surface of the respective roller 3, 4, initially in excess and directly following this application, the coating is doctored to the desired film thickness by the doctor bar 1. The doctor bar 1 is thus rotatable in a known manner in a doctor bed open toward the roller, 3, 4 and in which the doctor bar is journaled, the doctor bed being disposed in a holder so that it extends over the total working width of the apparatus and thus braces the doctor bar 1. On the back side of the doctor bed there is a pressurizable tube which can be pressurized with compressed air to press the doctor bar against the roller 3, 4.

The doctor bar according to the invention can also advantageously be used with conventional apparatus for the direct cooling of a paper or cardboard web. In this apparatus, the coating material is directly applied to the paper or cardboard web and is metered thereon. It has a counter-roller around which the paper or cardboard web is guided. In a loop region of the web an applicator unit is provided in the region of the counter-roller, especially a roller or nozzle applicator unit to apply the coating material in excess to the web. Downstream of the applicator in the web travel direction there follows a metering system with a metering element which skims from the web the superfluous coating material to the desired coating weight. The metering element is preferably a doctor bar with a smooth outer surfaces and which has been surface treated in the described manner.

What is claimed is:

1. A doctor bar for a coating apparatus comprising:
   a cylindrical base body;
   a hard material layer of chromium or ceramic; and
   a filling compound formed on said hard material layer by ion implantation bombardment thereof by ions from a plasma, formed by reaction of a component of said hard material layer with a component of gas in a region of the ion implantation bombardment, and filling cracks and craters in a surface of the hard material layer.

2. The doctor bar defined in claim 1 wherein said filling compound is formed by treating said surface with an ion mixture containing at least one element selected from the group which consists of carbon and nitrogen and free from metal ions.

3. The doctor bar defined in claim 2 wherein said filling compound is selected from the group which consists of chromium nitride, chromium carbide and chromium carbonitride.

4. The doctor bar defined in claim 3 wherein said hard material layer is a chromium layer of a thickness of 20 $\mu$m to 60 $\mu$m.

5. The doctor bar defined in claim 4 wherein said thickness is 40 $\mu$m to 50 $\mu$m.

6. The doctor bar defined in claim 3 wherein said layer has a hardness in excess of 1200 HV following the ion implantation bombardment.

7. The doctor bar defined in claim 6 wherein said hardness is 1400 HV to 1600 HV.

8. The doctor bar defined in claim 6 wherein said surface is formed with circumferential grooves with an open cross sectional area of said grooves of 25 $mm^2$ to 150 $mm^2$ per meter of the bar length.

9. The doctor bar defined in claim 8 wherein said grooves have axial widths of 0.1 mm to 0.3 mm and a depth 0.07 mm to 0.13 mm.

10. A method of making a doctor bar for a coating apparatus comprising the steps of:
    providing a cylindrical base body with a hard material layer of chromium or ceramic; and
    forming a filling compound on said hard material layer by ion implantation bombardment thereof by ions from a plasma producing the filling compound by reaction of a component of said hard material layer with a component of gas in a region of the ion implantation bombardment, and filling cracks and craters in a surface of the hard material layer.

11. The method defined in claim 10 wherein said filling compound is formed by treating said surface with an ion mixture containing at least one element selected from the group which consists of carbon and nitrogen and free from metal ions.

12. The method defined in claim 11 wherein said filling compound is selected from the group which consists of chromium nitride, chromium carbide and chromium carbonitride, said hard material layer is a chromium layer of a thickness of 20 $\mu$m to 60 $\mu$m, and said layer has a hardness in excess of 1200 HV following the ion implantation bombardment.

13. The method defined in claim 12 wherein said thickness is 40 $\mu$m to 50 $\mu$m.

14. The method defined in claim 12 wherein said hardness is 1400 HV to 1600 HV.

15. The method defined in claim 12 wherein said surface is formed with circumferential grooves with an open cross sectional area of said grooves of 25 mm² to 150 mm² per meter of the bar length, and said grooves have axial widths of 0.1 mm to 0.3 mm and a depth 0.07 mm to 0.13 mm.

16. An apparatus for coating a web of paper or cardboard, comprising:

two rollers journaled on a support and straddling said web, a first of said rollers having a fixed axis and second of said rollers being pressable toward said first of said rollers;

means for applying a coating composition to at least one of said rollers for transfer to said web; and a doctor bar acting upon said one of said rollers for metering a quantity of said coating composition thereon, said doctor bar comprising:

a cylindrical base body, a hard material layer of chromium or ceramic, and a filling compound formed on said hard material layer by ion implantation bombardment thereof by ions from a plasma, formed by reaction of a component of said hard material layer with a component of gas in a region of the ion implantation bombardment, and filling cracks and craters in a surface of the hard material layer.

* * * * *